United States Patent
Nishino et al.

(10) Patent No.: US 8,769,810 B2
(45) Date of Patent: Jul. 8, 2014

(54) PART MOUNTING METHOD

(75) Inventors: Toru Nishino, Kawasaki (JP); Kazuyuki Ikura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1191 days.

(21) Appl. No.: 12/699,958

(22) Filed: Feb. 4, 2010

(65) Prior Publication Data

US 2010/0132187 A1 Jun. 3, 2010

Related U.S. Application Data

(63) Continuation of application No. PCT/JP2007/066017, filed on Aug. 17, 2007.

(51) Int. Cl.
| | |
|---|---|
| *H05K 3/30* | (2006.01) |
| *H05K 13/00* | (2006.01) |
| *H05K 13/04* | (2006.01) |
| *H05K 13/08* | (2006.01) |
| *H01L 21/70* | (2006.01) |
| *H01L 21/82* | (2006.01) |
| *H01L 23/00* | (2006.01) |
| *H01L 25/00* | (2006.01) |

(52) U.S. Cl.
CPC ........ H05K 13/0015 (2013.01); H05K 13/0413 (2013.01); H05K 13/0452 (2013.01); H05K 13/0478 (2013.01); H05K 13/08 (2013.01); *H01L 21/70* (2013.01); *H01L 21/82* (2013.01); *H01L 24/81* (2013.01); *H01L 24/82* (2013.01); *H01L 24/85* (2013.01); *H01L 25/50* (2013.01); *H01L 2224/279* (2013.01); *H01L 2224/43* (2013.01); *H01L 2224/82* (2013.01)
USPC .................. 29/834; 29/825; 29/832; 29/836; 29/842; 29/854; 361/233; 361/234

(58) Field of Classification Search
CPC ..... H05K 3/007; H05K 3/0097; H05K 3/303; H05K 13/0015; H05K 13/0413; H05K 13/0452; H05K 13/0478; H05K 13/08; H01L 21/70; H01L 21/82; H01L 24/81; H01L 24/82; H01L 24/85; H01L 23/544; H01L 25/50; H01L 29/401; H01L 29/66007; H01L 2224/279; H01L 2224/43; H01L 2224/92
USPC ........... 29/593, 739, 740, 742, 743, 825, 833, 29/834, 836, 842; 361/233, 234; 428/411.1, 339, 332; 414/737, 749.3; 901/20
See application file for complete search history.

(56) References Cited

U.S. PATENT DOCUMENTS

| | | | |
|---|---|---|---|
| 6,071,630 A * | 6/2000 | Tomaru et al. | 428/627 |
| 7,077,262 B2 * | 7/2006 | Kabeshita et al. | 198/817 |

(Continued)

FOREIGN PATENT DOCUMENTS

| | | |
|---|---|---|
| JP | 2-35000 A | 2/1990 |
| JP | 7-162200 A | 6/1995 |

(Continued)

OTHER PUBLICATIONS

International Search Report of PCT/JP2007/066017, mailing date of Sep. 11, 2007.

*Primary Examiner* — Paul D Kim

(74) *Attorney, Agent, or Firm* — Westerman, Hattori, Daniels & Adrian, LLP

(57) ABSTRACT

A part mounting method of mounting first mounting parts and a second mounting part to a board includes taking an image of a configuration of the second mounting part and performing an image-recognition, mounting the first mounting parts to the board based on a result of the image-recognition of the configuration of the second mounting part, and mounting the second mounting part to the board based on a result of an image-recognition of the first mounting parts mounted to the board.

7 Claims, 16 Drawing Sheets

(56) References Cited

U.S. PATENT DOCUMENTS

| | | | |
|---|---|---|---|
| 7,200,922 B2 * | 4/2007 | Kabeshita et al. | 29/740 |
| 7,437,818 B2 * | 10/2008 | Kabeshita et al. | 29/832 |
| 8,001,678 B2 * | 8/2011 | Kabeshita et al. | 29/740 |
| 8,011,086 B2 * | 9/2011 | Lee et al. | 29/832 |
| 8,156,642 B2 * | 4/2012 | Maenishi | 29/834 |
| 2007/0101572 A1 * | 5/2007 | Kabeshita et al. | 29/832 |
| 2008/0127486 A1 * | 6/2008 | Hirata et al. | 29/832 |
| 2009/0000810 A1 * | 1/2009 | Koga | 174/255 |

FOREIGN PATENT DOCUMENTS

| | | |
|---|---|---|
| JP | 9-8104 A | 1/1997 |
| JP | 11-40996 A | 2/1999 |
| JP | 2000-315895 A | 11/2000 |
| JP | 2003-101234 A | 4/2003 |
| JP | 2005-252007 A | 9/2005 |
| JP | 2007-59652 A | 3/2007 |

* cited by examiner

PART MOUNTING METHOD

CROSS-REFERENCE TO RELATED APPLICATIONS

This application is a U.S. continuation application, filed under 35 USC 111(a) and claiming the benefit under 35 USC 120 and 365(c), of PCT application JP2007/066017 filed Aug. 17, 2007. The foregoing application is hereby incorporated herein by reference.

FIELD

The embodiment discussed herein is directed to a part mounting apparatus and method.

BACKGROUND

As a mounting method for mounting electronic parts and optical parts to a board, there are face-up alignment mounting and face-down alignment mounting. The face-up alignment mounting is a mounting method of image-recognizing a mounting position on a board and a front surface (top surface) of a mounting part, and moving the mounting part to the mounting position. The face-down alignment mounting is a mounting method of image-recognizing a mounting position on a board and a back surface (bottom surface) of a mounting part, and moving the mounting part to the mounting position. Because an image-recognition mechanism (a camera, a mounting part supporting apparatus, etc.) used in the face-up alignment mounting and the image-recognition mechanism (a camera, a mounting part supporting apparatus, etc.) used in the face-down alignment mounting are different in their arrangements and configurations, the face-up alignment mounting and the face-down alignment mounting are carried out using different mounting apparatuses.

FIG. 1 is a perspective view illustrating an outline structure of a face-up alignment mounting apparatus. A mounting board 1 is placed on an XY-stage 2, and an optical part 3A, which is a mounting part, is supported by a head 5 attached to a Z-stage 4. The head 5 is formed of a transparent material such as glass. A camera 6 is arranged above the Z-stage 4 so that a front surface (top surface) of the optical part 3A supported by the transparent head 5 can be image-recognized through a through hole 4a penetrating through the Z-stage 4. The camera 6 can carry out image recognition of a mounting surface of the mounting board 1 through the transparent head 5. The camera 6 is movable up and down by a Z-axis moving mechanism 7, and, thereby, the focal position of the camera 6 can be located at the front surface of the optical part 3 or at the mounting surface of the mounting board 1.

FIG. 2 is a perspective view illustrating an outline structure of a face-down alignment mounting apparatus. A mounting board 1 is placed on an XY-stage 12. A camera 16 is arranged above the position where a mounting board 1 is placed. The camera 16 is capable of image-recognizing the mounting surface of the mounting board 1 on an XY-stage 12. The camera 16 is movable up and down by a Z-axis moving mechanism 17, and, thereby, the focal position of the camera 16 can be placed at the mounting surface of the mounting board 1.

In the face-down alignment mounting apparatus illustrated in FIG. 2, a Z-stage 14 is provided at a position shifted from the camera 16, and a mounting part supporting head 15 is attached to the Z-stage 14. The Z-stage 14 is movable up and down by a Z-axis moving mechanism 18. A camera 19 is provided above the XY-stage 12 so that the back surface (bottom surface) of the optical part 20, which is a mounting part supported by the head 15, can be image-recognized by the camera 19. It should be noted that the face-down alignment mounting illustrated in FIG. 2 is a process for mounting the optical part 20 on the optical parts 3A and 3B.

Here, a description will be given, with reference to FIG. 3A through FIG. 8, of a process of mounting the optical parts 3A, 3B and 20 to the mounting board 1 using the mounting apparatuses illustrated in FIG. 1 and FIG. 2.

FIG. 3A is a plan view of the mounting board 1. FIG. 3B is a side view of the mounting board 1. Alignment marks 1a for position detection are provided to the mounting board 1. FIG. 4A is a plan view of the mounting board 1 after mounting the optical part 3B. FIG. 4B is a side view of the mounting board 1 after mounting the optical part 3B. FIG. 5A is a plan view of the mounting board 1 after mounting the optical part 3A. FIG. 5B is a side view of the mounting board 1 after mounting the optical part 3A. FIG. 6A is a plan view of the mounting board 1 after mounting the optical part 20. FIG. 6B is a side view of the mounting board 1 after mounting the optical part 20. FIG. 7 is a flowchart of a process of mounting the optical parts 3A and 3B on the mounting board 1 using the face-up alignment mounting apparatus illustrated in FIG. 1. FIG. 8 is a flowchart of a process of mounting the optical part 20 on the mounting board 1 using the face-down alignment mounting apparatus illustrated in FIG. 2.

In the mounting process illustrated in FIG. 7, the optical parts 3A and 3B are mounted to the mounting board 1. First, in step S1, the alignment patterns 1a provided on the mounting surface of the mounting board 1 placed on the XY-stage 2 are detected by image recognition by the camera 6. At this time, the image recognition by the camera 6 is carried out by the picture of the mounting surface of the mounting board 1 taken through the through hole 4a of the Z-stage 4 and the transparent head 5.

Next, in step S2, a position where the optical part 3B is to be suction-attached and held by the head 5 is determined. The optical part 3B is accommodated in a part tray (not illustrated in the figure) provided on the XY-stage 2, and the suction-attaching position of the optical part 3B is detected by image-recognizing the optical part 3B by the camera 6 by moving the part tray under the head 5 by driving the XY-stage 2.

Subsequently, in step S3, the optical part 3B is suction-attached and held by the head 5 in accordance with the suction-attaching position detected in step S2. Then, the mounting board 1 is located under the head 5 again by driving the XY-stage 2. Then, in step S4, the mounting surface of the mounting board 1 is image-recognized by the camera 6, and the mounting position of the optical part 3B is computed. Then, in step S5, the XY-stage 2 is moved so that the mounting position computed is located under the optical part 3B suction-attached by the head 5, and the optical part 3B is mounted on the mounting board 1 by moving the head 5 downward by driving the Z-stage 4. FIGS. 4A and 4B illustrate a state where the optical part 3B is mounted on the mounting board 1. Then, in step S6, the position where the optical part 3B is mounted is detected based on the image recognition of the camera 6.

Next, in step S7, the suction-attaching position of the optical part 3A is detected. The optical part 3A is accommodated in a part tray (not illustrated in the figure) provided on the XY-stage 2, and the suction-attaching position of the optical part 3A is detected by image-recognizing the optical part 3A in the part tray by the camera 6 by moving the part tray under the head 5 by driving the XY-stage 2.

Then, in step S8, the optical part 3A is suction-attached and held by the head 5 based on the suction-attaching position detected in step S7. Then, the mounting board 1 is located under the head 5 again by driving the XY-stage 2. Then, in step S9, the mounting surface of the mounting board 1 is image-recognized by the camera 6, and the mounting position of the optical part 3A is computed. At this time, the mounting position of the optical part 3A is computed based on the position of the optical part 3A suction-attached to the head 5 and the position of the optical part 3B on the mounting board 1. Then, the XY-stage 2 is moved so that the mounting position computed in step S9 is located under the optical part 3A suction-attached by the head 5, and the optical part 3A is mounted on the mounting board 1 by moving the head 5 downward by driving the Z-stage 4. FIGS. 5A and 5B illustrate a state where the optical parts 3A and 3B are mounted on the mounting board 1.

According to the above-mentioned process, the optical parts 3A and 3B are mounted on the mounting board 1. Because the optical part 3A is mounted based on the result of detection of the position of the optical part 3B, which is mounted first, the optical parts 3A and 3B can be mounted with a highly accurate positional relationship.

After mounting the optical parts 3A and 3B to the mounting board 1, the process proceeds to a mounting process of the optical part 20. Here, the optical part 20 has on its back surface (bottom surface) functional parts, which cooperate with the optical parts 3A and 3B mounted previously, and the optical part must be arranged on the optical parts 3A and 3B so that the optical parts 3A and 3B and the functional parts are in an aligned state. Thus, a mounting operation of the optical part 20 to the mounting board 1 is performed in the mounting process illustrated in FIG. 8 using the face-down alignment mounting apparatus while image-recognizing the back surface (bottom surface) of the optical part 20. Therefore, after mounting the optical parts 3A and 3B to the mounting board 1, it is necessary to move the mounting board 1 to the XY-stage 12 of the face-down alignment mounting apparatus.

After moving and placing the mounting board 1 onto the XY-stage 12 of the face-down alignment mounting apparatus, first in step S11, the optical part 20 is suction-attached to and held by the head 15. The optical part 20 is accommodated in the part tray (not illustrated in the figure) provided on the XY-stage 12, and the XY-stage 12 is driven to move the part tray under the head 15 to hold the optical part 20 by the head 15. In this case, the position of the optical part 20 accommodated in the part tray has been image-recognized previously by the camera 16 and stored as image data, and the position of the optical part 20 can be detected from the image data as a result of the image-recognition and the optical part 20 can be held by the head 15.

After holding the optical part 20 by the head 15, the mounting board 1 is image-recognized, in step S12, by the camera 16 to detect the position of the optical part 3A previously mounted. Further, in step S13, the position of the optical part 3B previously mounted is also detected.

Subsequently, in step S14, the back surface (bottom surface) of the optical part 20 held by the head 15 is image-recognized to detect the present holding position of the optical part 20. Then, in step S15, the mounting position of the optical part 20 is computed based on the result of detection of the optical parts 3A and 3B in steps S12 and S13. Then, in step S16, the XY-stage 12 is driven to move the XY-stage 12 so that the computed mounting position is aligned with the optical part 20 held by the head 15, and the Z-stage 14 is moved downward to mount the optical part 20 to the mounting board 1. At this time, as illustrated in FIGS. 6A and 6B, the functional parts 20a of the optical part 20 is in an aligned state with the optical parts 3A and 3B.

As mentioned above, according to the conventional mounting method, face-up alignment mounting of the optical parts 3A and 3B is performed first, and, subsequently, face-down alignment mounting of the optical parts 20 is performed. That is, although the mounting apparatuses are different, the positions of the mounting board 1 and the optical parts 3A and 3B are image-recognized by the cameras 6 and 16 from the upper side and the back surface of the optical part 20 is image-recognized by the camera 19, and the mounting position of the optical part 20 is determined according to the thus-acquired image-recognition data.

Here, there is suggested a chip bonding apparatus which, when mounting a single semiconductor chip to a board according to face-down alignment mounting, performs positioning of the semiconductor chip by image-recognizing the back surface of the semiconductor chip by one camera and image-recognizing the mounting surface of the board by another camera (for example, refer to Japanese Laid-Open Patent Application No. 9-8104).

As mentioned above, in the case where after mounting a plurality of first mounting parts (corresponding to the optical parts 3A and 3B) to a board according to face-up alignment mounting, a second mounting part (corresponding to the optical part 20) is mounted to the board (corresponding to the mounting board 1) according to face-down alignment mounting, the plurality of mounting parts can be mounted on the board with high positional accuracy with each other and the second mounting part can be accurately positioned to the plurality of first mounting parts on the board. However, because there is a manufacturing variation in the position of the functional parts in the second mounting part, even if the relative position accuracy is raised, there may be a problem in that the first mounting parts cannot be accurately positioned to the respective functional parts of the second mounting part having variation in the relative positions.

Additionally, when performing face-down alignment mounting, there is a problem in that the camera for image-recognizing the mounting surface of the board and the camera for image-recognizing the back surface of the part are different cameras, and it is difficult to prevent an offset even if the positions and angles of the cameras are accurately corrected and the results of the image-recognition results are combined.

Further, if the resolution of the cameras is increased in order to perform highly accurate image-recognition, the view is narrowed and it becomes difficult to recognize the position of the part accommodated in the part tray. Thus, if a wide-view camera for recognizing the part positions is provided separately, it invites an increase in size and cost of the mounting apparatus.

SUMMARY

According to an aspect of the invention, a part mounting apparatus for mounting a plurality of mounting parts to a board, includes: a placement stage on which the board is placed; a first part support part supporting a first mounting part; a second part support part supporting a second mounting part; a first camera image-recognizing the first mounting part supported by the first part support part from above, and image-recognizing a mounting surface of the board placed on the placement stage from above the first part support part; and a second camera image-recognizing the second mounting part supported by the second part support part from underneath.

Additionally, according to another aspect of the present invention a part mounting method of mounting first mounting parts and a second mounting part to a board, includes: taking an image of a configuration of the second mounting part and performing an image-recognition; mounting the first mounting parts to the board based on a result of the image-recognition of the configuration of the second mounting part; and mounting the second mounting part to the board based on a result of an image-recognition of the first mounting parts mounted to the board.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENT(S)

Preferred embodiment of the present invention will be explained with reference to the accompanying drawings.

Figure 1:
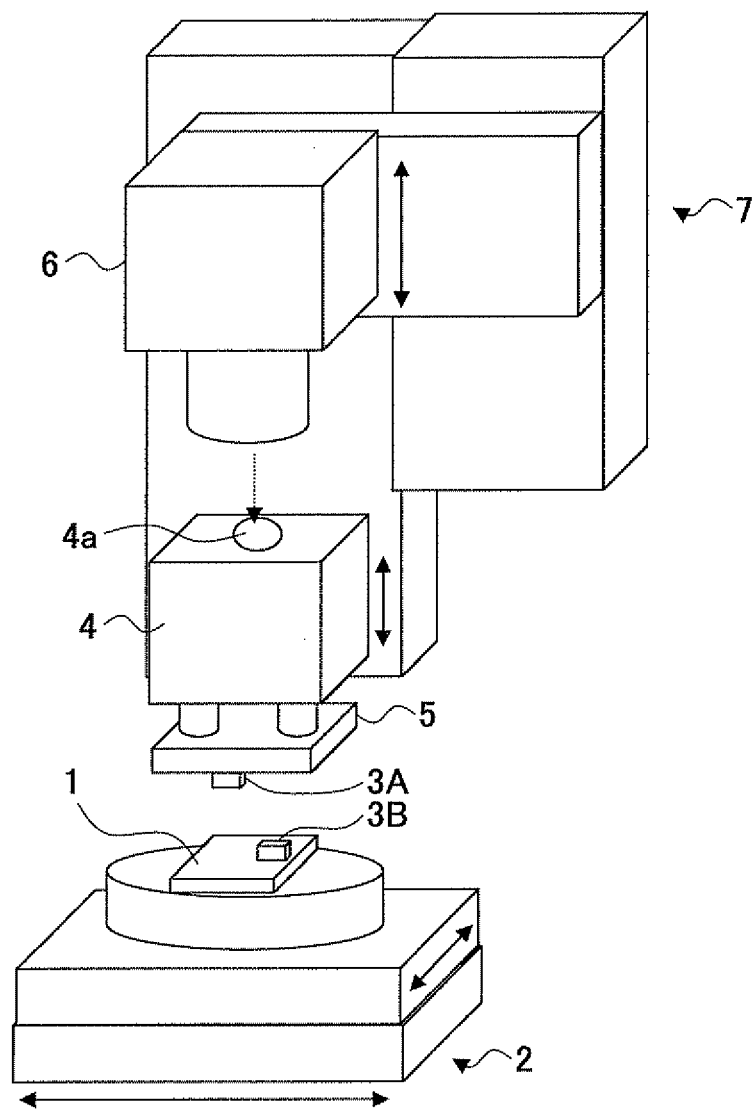
FIG. 1 is a perspective view illustrating an outline structure of a face-up alignment mounting apparatus.
Figure 2:
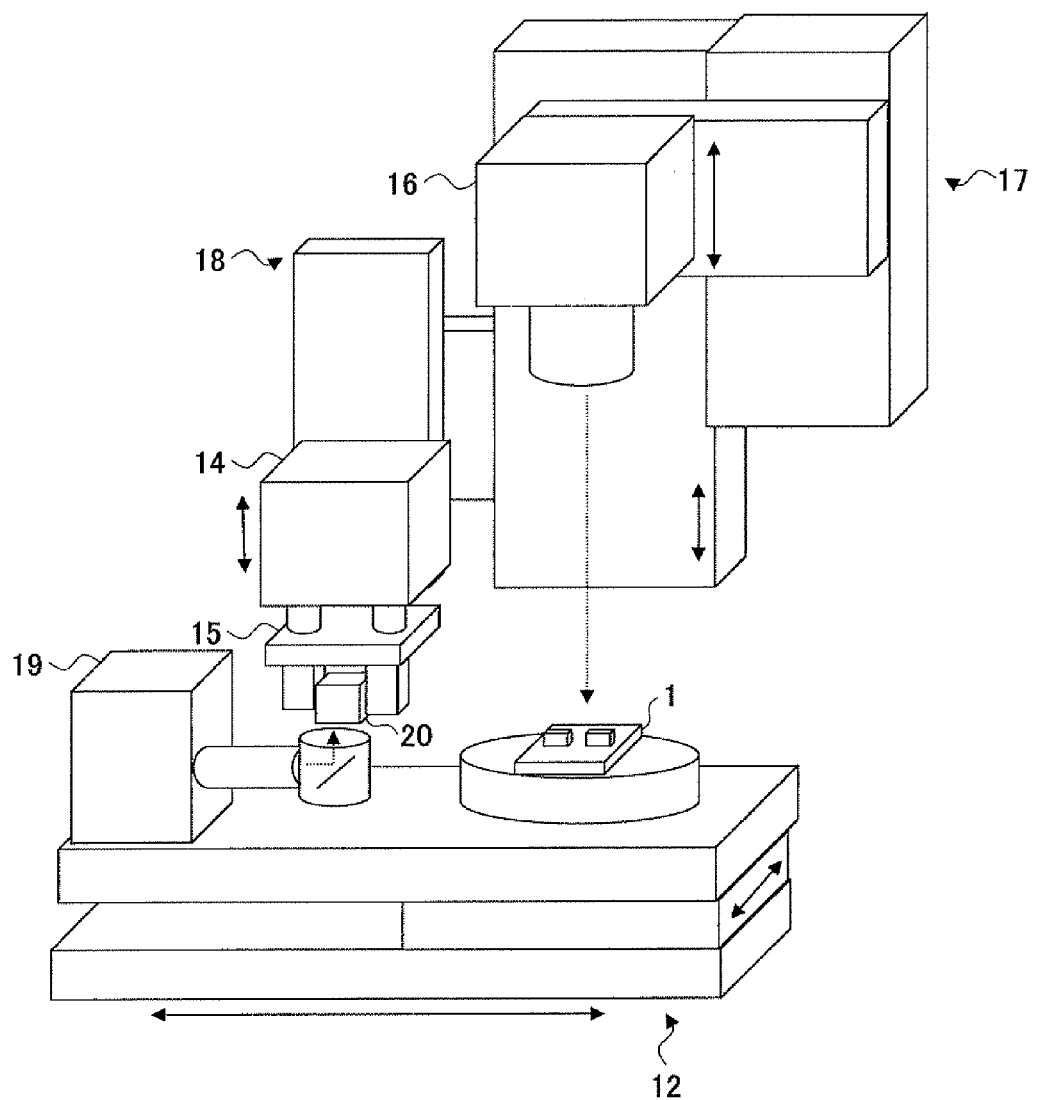
FIG. 2 is a perspective view illustrating an outline structure of a face-down alignment mounting apparatus.
Figure 3A:
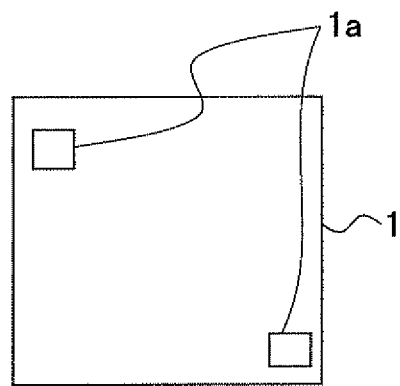
FIG. 3A is a plan view of the mounting board 1.
Figure 3B:
FIG. 3B is a side view of the mounting board.
Figure 4A:
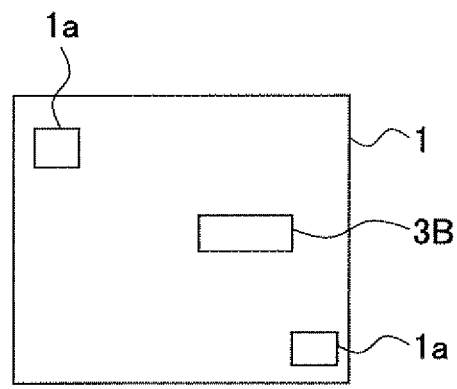
FIG. 4A is a plan view of the mounting board after mounting an optical part.
Figure 4B:
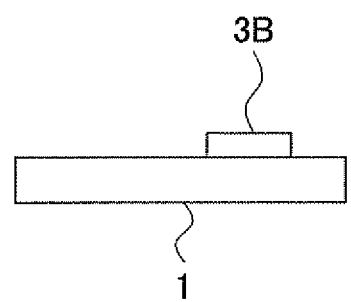
FIG. 4B is a side view of the mounting board after mounting the optical part.
Figure 5A:
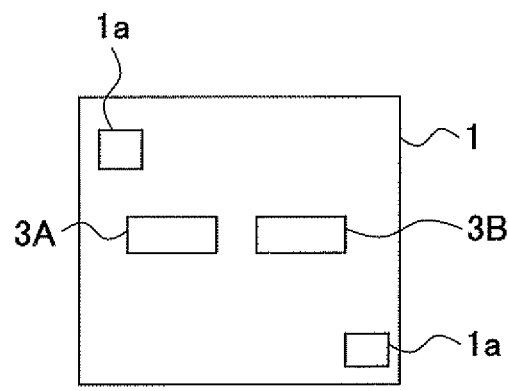
FIG. 5A is a plan view of the mounting board after mounting another optical part.
Figure 5B:
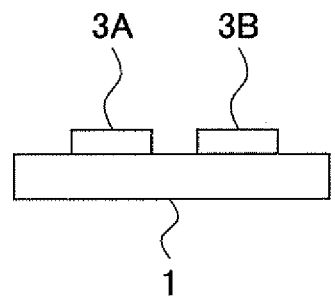
FIG. 5B is a side view of the mounting board after mounting the another optical part.
Figure 6A:
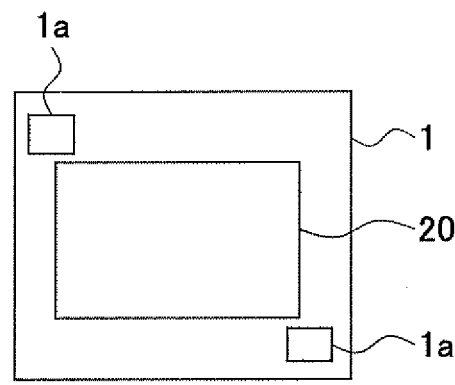
FIG. 6A is a plan view of the mounting board 1 after mounting a further optical part 20.
Figure 6B:
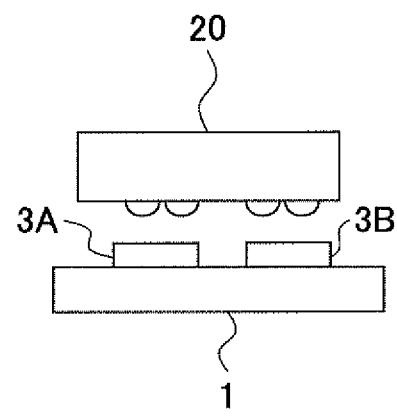
FIG. 6B is a side view of the mounting board after mounting the further optical part.
Figure 7:
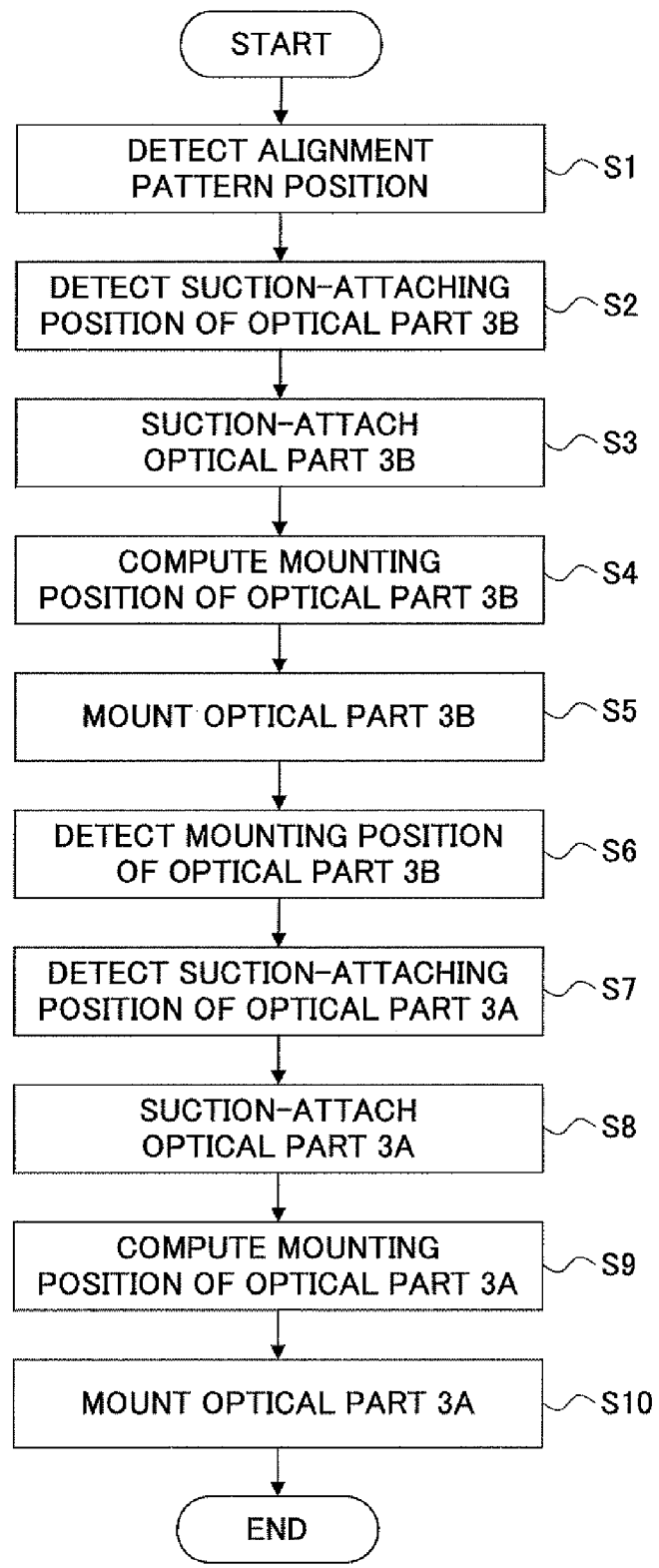
FIG. 7 is a flowchart of a process of mounting the optical parts on the mounting board using the face-up alignment mounting apparatus.
Figure 8:
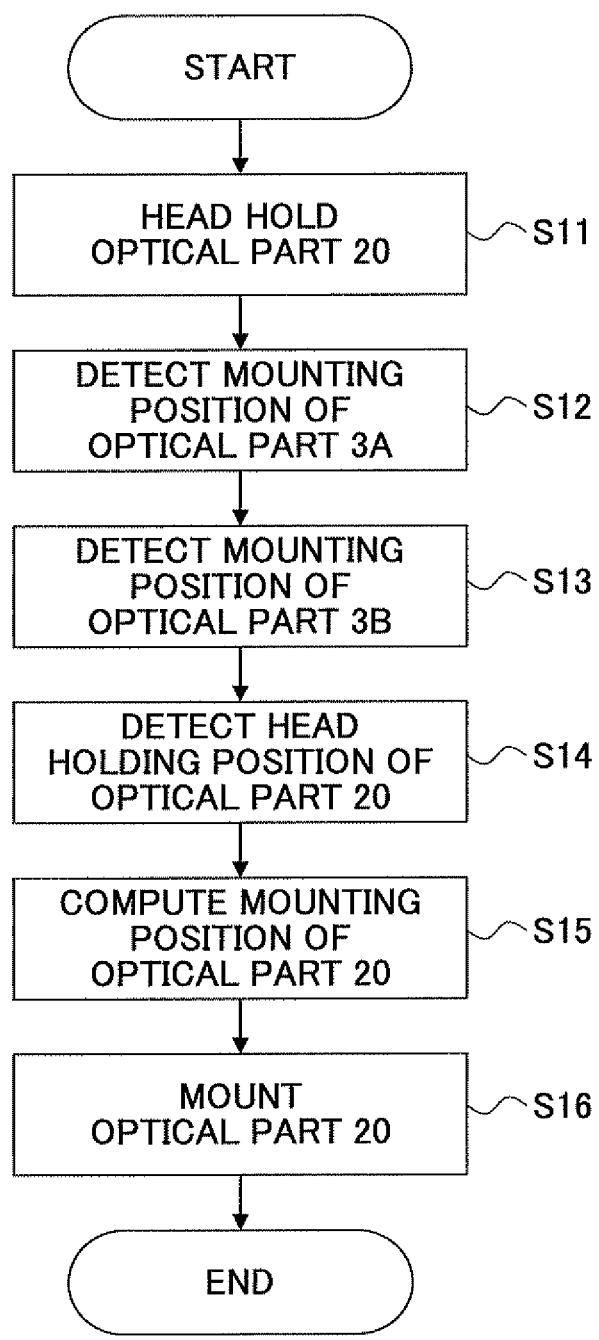
FIG. 8 is a flowchart of a process of mounting the optical part on the mounting board using the face-down alignment mounting apparatus.
Figure 9:
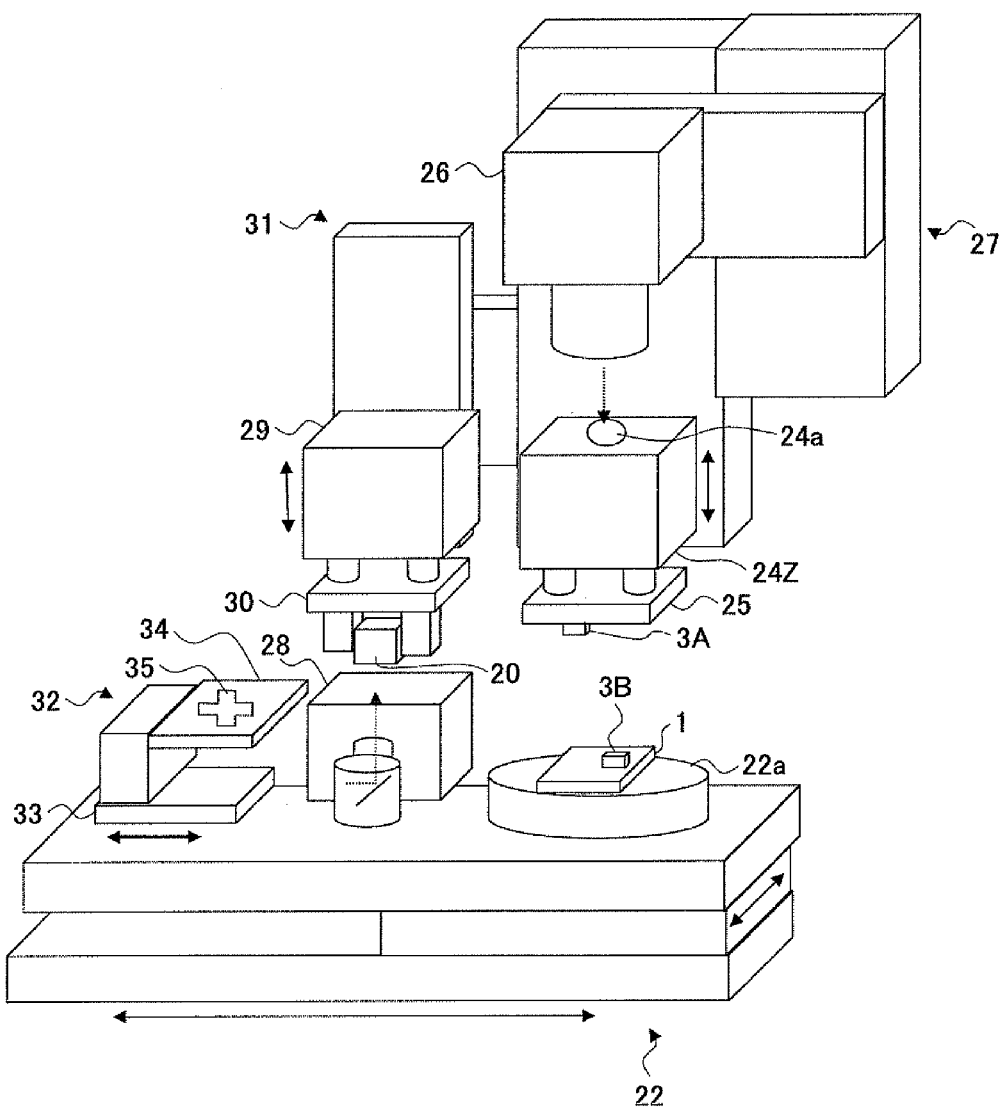
FIG. 9 is a perspective view illustrating an outline structure of a part mounting apparatus according to an embodiment of the present invention.

First, a description will be given, with reference to FIG. 9, of a part mounting apparatus according to an embodiment of the present invention. FIG. 9 is a perspective view of a part mounting apparatus according to an embodiment of the present invention.

The part mounting apparatus illustrated in FIG. 9 is an apparatus for mounting a mounting part, such as an electronic part and an optical part, to a mounting board, and it is configured so that face-up alignment mounting and face-down alignment mounting can be performed continuously by one apparatus. In the example illustrated in FIG. 9, optical parts 3A and 3B (first mounting parts) and an optical part 20 (second mounting part) are mounted as mounting parts to the mounting board 1.

The part mounting apparatus illustrated in FIG. 9 includes an XY-stage 22, which is movable in an X-axis direction and a Y-axis direction. Provided on the XY-stage 22 is a placement stage 22a on which the mounting board 1 is placed. The optical parts 3A and 3B, which are mounting parts, are supported by a head 25 attached to a Z-stage 24, which is movable in a Z-axis direction. A camera 26 as a first camera is arranged above the Z-stage 24 so that a front surface (top surface) of the optical part 3A supported by the transparent head 25 can be image-recognized through a through hole 24a penetrating the Z-stage 24. Moreover, the camera 26 can image-recognize a mounting surface of the mounting board 1 through the transparent head 25. The camera 26 is movable up and down by a Z-axis moving mechanism 27, and, thereby, a focal point of the camera 26 can be located at the front surface of the optical part 3A, or located at the mounting surface of the mounting part 1. It should be noted that, in FIG. 9, another optical part 3B has already been mounted at a specified position of the mounting board 1 according to face-up alignment mounting.

Figure 10:
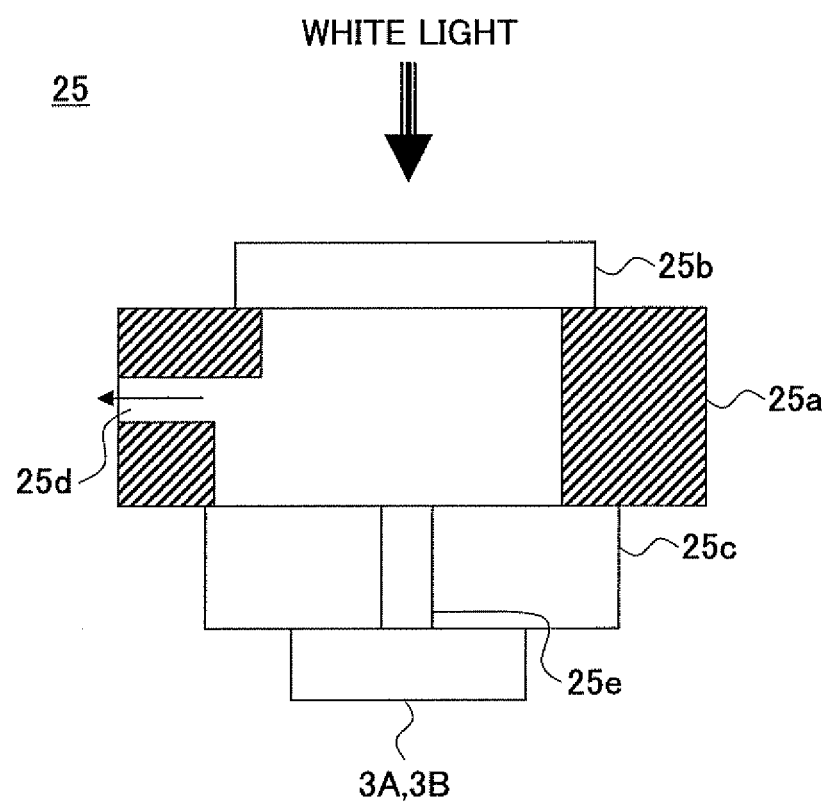
FIG. 10 is a cross-sectional view of a head for holding an optical part.

FIG. 10 is a cross-sectional view of the above-mentioned head 25 for supporting the optical parts 3A and 3B. The head 25 includes a member 25a having a space penetrating vertically, an upper plate 25b provided to close an upper side of the space of the member 25a, and a lower plate 25c provided to close the lower side of the space of the member 25a. The upper plate 25b and the lower plate 25c are formed by a transparent material such as, for example, glass. The member 25a can be any material if it has a rigidity of a certain degree, and may be formed by, for example, aluminum.

The space inside the member 25a is closed by the upper plate 25b and the lower plate 25c. A suction passage 25d is formed in the member 25a in order to suction air in the interior space. Additionally, a suction-attaching hole 25e communicating with the inner space is formed in the lower plate 25c. By suctioning air inside the interior space from the suction passage 25d, the optical parts 3A and 3B can be suction-attached and held through the suction-attaching hole 25e of the lower plate 25c.

Because the upper plate 25b and the lower plate 25c are formed by a transparent material, a light irradiated from above the head 25 is irradiated onto front surfaces (top surfaces) of the optical parts 3A and 3B by transmitting through the head 25. Thereby, an image of the front surfaces (top surfaces) of the optical parts 3A and 3B can be taken by the camera 26, which is arranged above the head 25. Additionally, the light transmitted through the head 25 is also irradiated onto the mounting board 1, which is arranged under the head 25, and an image of the mounting surface of the mounting board 1 can be taken by the camera 26 arranged above the head 25. It should be noted that the illumination light irradiated through the head 25 is preferably a white light so that interference fringes due to reflection of light are not generated in the front surfaces of the upper plate 25b and the lower plate 25c of the head 25.

In addition, the head 25 is attached to the Z-stage 24 using a hydrostatic bearing in order to reduce a pressure of pressing the head 25 to the optical parts 3A and 3B when suction-attaching the optical parts 3A and 3B. Thereby, the optical parts 3A and 3B are prevented from being damaged or losing their functions. The hydrostatic bearing has a well-known structure and an explanation thereof is omitted.

A camera 28 as a second camera is provided in the XY-stage 22 for carrying out image-recognition of the back surface of the optical part 20. A Z-stage 29, which is movable in a Z-axis direction, is provided above the camera 28, and a head 30 for supporting a mounting part is attached to the Z-stage 29. The Z-stage 29 is movable up and down by a Z-axis moving mechanism 31, and, thereby, the head 30 is also movable up and down. The head 30 has a mechanism for supporting the optical part 20. Although the head 30 grasps and supports the optical part 20 in the example illustrated in FIG. 9, the head 30 may be configured to suction-attach and hold the optical part 20 similar to the head 25.

Moreover, a camera alignment unit 32 is provided to the XY-stage 22. The camera aligning unit 32 is a mechanism for performing a correction to accurately aligning a position on an image taken by the camera 26 as the first camera for image-recognizing the front surfaces (top surfaces) of the optical parts 3A and 3B with a position on an image taken by the camera 28 as the second camera for image-recognizing the back surface (bottom surface) of the optical part 20.

The camera alignment unit 32 is attached to the XY-stage 22 via a moving mechanism 33 to be movable on the XY-stage 22. The camera aligning unit 32 has an alignment mark member 34, which extends parallel to the top surface of the XY stage 22. An alignment mark 35 is provided to the alignment mark member 34. The alignment mark 35 is a hole of a specified shape or a slit formed to penetrate the alignment mark member 34. The planar shape of the hole or slit is, for example, a cross-shape in order to be able to easily recognize XY directions and a rotating direction. Alternatively, an arrangement of a plurality of circular holes may be used as an alignment mark.

Figure 11:
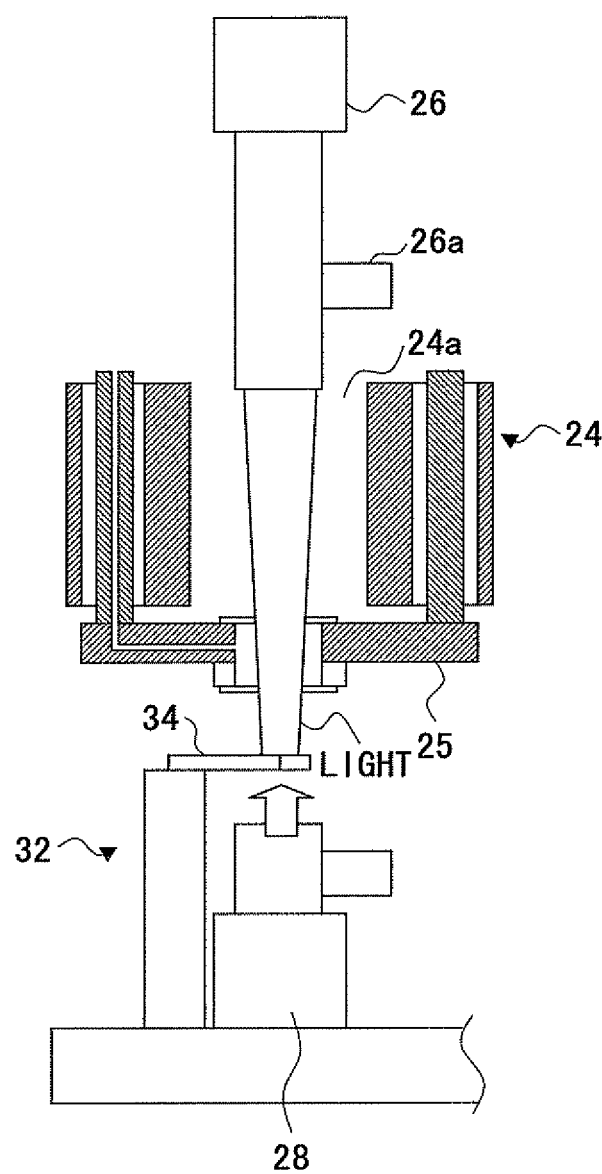
FIG. 11 is an illustration illustrating a process of detecting an alignment mark by an upper side camera.

Here, a description will be given, with reference to FIG. 11 and FIG. 12, of an alignment of the upper camera 26 and the lower camera 28. FIG. 11 is an illustration illustrating a process of detecting the alignment mark 35 by the upper camera 26, and FIG. 12 is an illustration illustrating a process of detecting the alignment mark 35 by the lower camera 28.

In order to align the camera 26 and the camera 28, the camera alignment unit 32 is moved by driving the moving mechanism to position the alignment mark member 34 to extend above the camera 28. The position of the alignment mark member 34 is adjusted so that the alignment mark 35 is located within the view of the cameral 28. Then, the camera 28 is located directly under the camera 26 by driving the XY-stage 22. Thereby, as illustrated in FIG. 11, the camera 28, the alignment mark member 34, the head 25 and the camera 26 are in an aligning state in the Z-axis direction (vertical direction). A coaxial illumination apparatus 26a is incorporated in the camera 26 so that an illumination light can be irradiated in a direction of a camera view. Similarly, a coaxial illumination apparatus 28a is incorporated in the camera 28 so that an illumination light can be irradiated in a direction of a camera view.

First, as illustrated in FIG. 11, an illumination light is irradiated from the upper camera 26, and the lower camera 28 takes an image. The illumination light passes through the through hole 24a of the Z-stage 24, and also passes through the transparent head 25 and irradiated onto the alignment mark member 34. Because the illumination light can pass through only a portion of the alignment mark 35 of the alignment mark member 34, the lower camera 28 can image-recognize the alignment mark 35.

Figure 12:
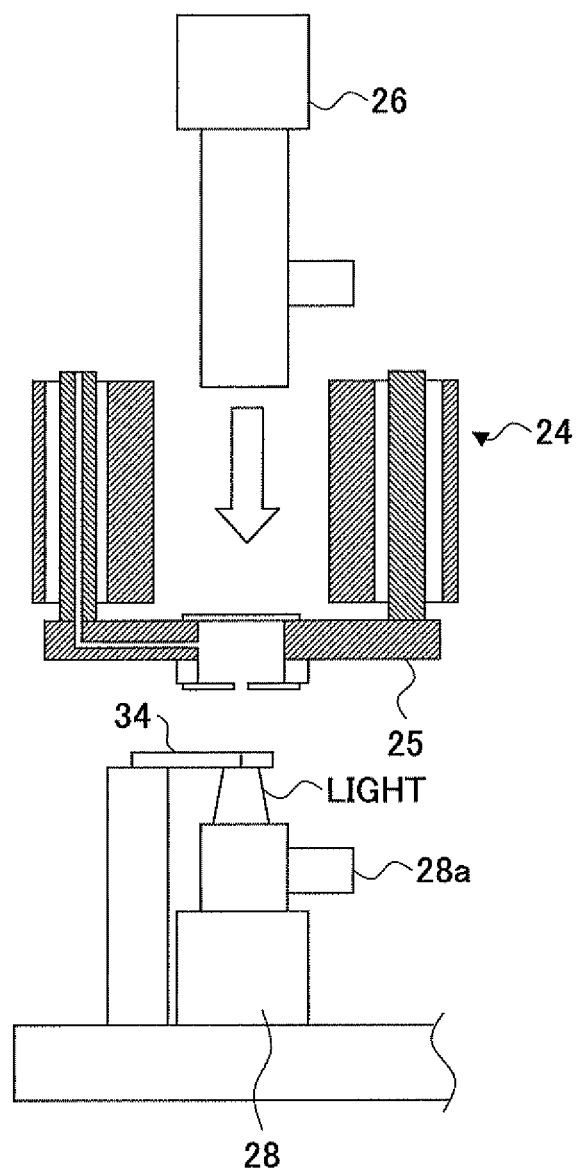
FIG. 12 is an illustration illustrating a process of detecting an alignment mark by a lower side camera.

Next, as illustrated in FIG. 12, an illumination light is irradiated from the lower cameral 28, and the upper camera 26 takes an image. The illumination light is irradiated onto the alignment mark member 34. Because the illumination light passes through only a portion of the alignment mark 35 of the alignment mark member 34, the upper camera 26 can image-recognize the alignment mark 35.

Then, when a misalignment is generated in the positional relationship between the image taken by the upper camera 26 and the image taken by the lower camera 28, the misalignment can be corrected by correcting the image data so that the position of the alignment mark 35 image-recognized by the upper camera 26 and the position of the alignment mark 35 image-recognized by the lower camera 28 are recognized as the same position. That is, the alignment of the upper camera 26 and the lower camera 28 can be performed with good accuracy by performing the data correction to recognize that, when viewing the same object by the upper camera 26 and the lower camera 28 in opposite directions, the object is at the same position.

Figure 13:
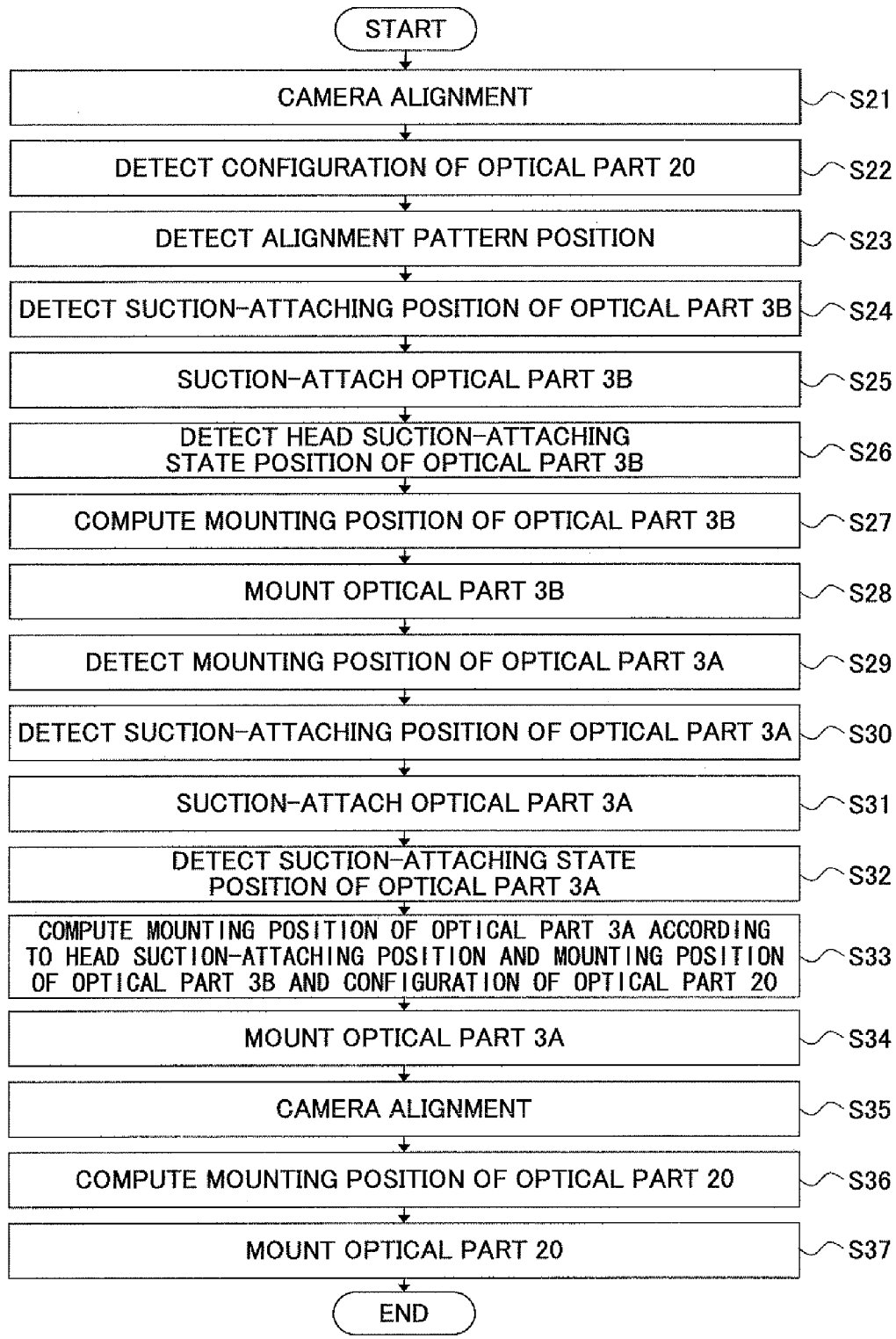
FIG. 13 is a flowchart of a mounting process performed using the part mounting apparatus illustrated in FIG. 9.

Next, a description will be given of a part mounting method performed using the part mounting apparatus illustrated in FIG. 9. FIG. 13 is a flowchart of a mounting process performed using the part mounting apparatus illustrated in FIG. 9.

In the mounting process illustrated in FIG. 13, the optical parts 3A and 3B and the optical part 20 are mounted to the mounting board 1. First, in step S21, an alignment of the first camera 26 and the second camera 28 is corrected according to the above-mentioned camera alignment. Next, in step S22, the optical part 20 which is the second mounting part, is supported by the head 30, and the configuration of the optical part 20 is detected by image-recognizing the back surface of the optical part 20 by the camera 28. That is, the configuration of the functional parts 20a of the back surface of the optical part 20 is detected by the camera 28, and the position of the functional parts 20a is computed and stored as data.

Next, in step S23, the alignment pattern 1a provided to the mounting surface of the mounting board 1 placed on the placement stage 22a of the XY-stage 22 is detected by image-recognition by the cameral 26. The image-recognition by the camera 26 is performed by the image of the mounting surface of the mounting board 1 taken through the through hole 24 of the X-stage 24 and the transparent head 25.

Next, in step S24, a determination is made of a position where the optical part 3B is suction-attached and held by the head 25. The optical part 3B is accommodated in a part tray (not illustrated in the figure) provided on the XY-stage 2, and the suction-attaching position of the optical part 3B can be detected by moving the part tray under the head 25 by moving the XY-stage 22 and image-recognizing the optical part 3B by the camera 26.

Subsequently, in step S25, the optical part 3B is suction-attached and held by the head 25 based on the suction attaching position detected in step S24. Then, the mounting board 1 is located again under the head 25 by moving the XY-stage 22. Next, in step S26, the optical part 3B suction-attached by the head 25 is image-recognized by the camera 26 in order to detect the position of the optical part 3B in the suction-attached state. Subsequently, in step S27, the mounting surface of the mounting board 1 is image-recognized by the camera 26, and the mounting position of the optical part 3B is computed.

Then, in step S28, the XY-stage 22 is moved so that the computed mounting position is located directly under the optical part 3B, which is suction-attached by the head 25, and the head 25 is moved downward by driving the Z-stage 24 to mount the optical part 3B onto the mounting board 1. Then, in step S29, the position where the optical part 3B is mounted is detected based on the image-recognition of the camera 26.

In addition, the image-recognition of the optical part 3B in the above-mentioned step S26 and the image-recognition of the mounting board 1 in step S27 are performed by the single camera 26. Specifically, when performing the image-recognition of the optical part 3B, the camera 26 or the head 25 is moved in the Z-axis direction so that the optical part 3B is located at a focal position of the camera 26, and, when performing the image-recognition of the mounting board 1, because the optical part 3B is located between the camera 26 and the mounting board 1, the optical part 3B is moved to the farthest position from the focal point so that, for example, the optical part 3B is preferably distant from the mounting board 1 by equal to or more than a half of the focal distance. For example, if the focal distance of the camera 26 is 65 mm, it is preferable to move the optical part 3B, when image-recognizing the mounting board 1, to a position distant from the mounting board 1 by 32.5 mm or more. Thereby, even if the optical part 3B is located within the view of the camera 26 when taking an image of the mounting board 1, the optical part 3B is not focused, which is in a defocused state, and the image-recognition of the mounting board 1 can be performed without any problems.

After completion of mounting the optical part 3B, then, in step S30, the suction-attaching position of the optical part 3A is detected. The optical part 3A is accommodated in a part tray (not illustrated in the figure) provided on the XY-stage 22, and the suction-attaching position of the optical part 3A is detected by moving the part tray under the head 25 by moving the XY-stage 22 and image-recognizing the optical part 3A by the camera 26.

Subsequently, in step S31, the optical part 3A is suction-attached and held by the head 25 based on the suction attaching position detected in step S30. Then, the mounting board 1 is located again under the head 25 by moving the XY-stage 22. Next, in step S32, the optical part 3A suction-attached by the head 25 is image-recognized by the camera 26 in order to detect the position of the optical part 3A in the suction-attached state.

Subsequently, in step S33, the mounting surface of the mounting board 1 is image-recognized by the camera 26, and the mounting position of the optical part 3A is computed. At this time, the mounting position of the optical part 3A is computed based on the position of the optical part 3A suction-attached by the head 25, the position of the optical part 3B on the mounting board 1 and the configuration (positions of the functional parts 20a) of the optical part 20 detected in step S22. Then, the XY-stage 22 is moved so that the mounting position computed in step S33 is located directly under the optical part 3A suction-attached by the head 25, and the head 25 is moved downward by driving the Z-stage 24 to mount the optical part 3A onto the mounting board 1.

As mentioned above, according to the present embodiment, because the configuration (positions of the functional parts 20a) of the optical part 20, which is mounted later, is taken into consideration when computing, in step S33, the mounting position of the optical part 3A relative to the optical part 3B, even if there is a manufacturing variation in the configuration and size of the optical part 20, the optical parts 3A and 3B can be mounted in a positional relationship, which matches the configuration of each optical part 20. Specifically, because in step S22, an interval of the functional parts 20a of the optical part 20 is previously detected in step S22 and the interval of the optical parts 3A and 3B is determined to match the interval of the functional parts 20a, the optical parts 3A and 3B can be mounted with good accuracy in accordance with each optical part 20 even if the interval of the functional parts 20a varies.

According to the above process, the optical parts 3A and 3B are mounted to the mounting board 1. Subsequently, the process proceeds to a mounting process of the optical part 20, and the part mounting apparatus illustrated in FIG. 9 is configured to be capable of performing face-down alignment mounting, and, therefore, there is no need to transfer the mounting substrate 1 and the image data and the detection results obtained by the previous image-recognition can be used in the subsequent process. Specifically, the holding position of the optical part 20 detected in step S22, the position of the mounting board 1 detected in step S23, the mounting position of the optical part 3B detected in step S29, the mounting position of the optical part 3A detected in step S32, etc., can be used also in the mounting process of the optical part 20.

After proceeding to the mounting process of the optical part 20, first, in step S35, the camera alignment is performed in the same manner as step S22. The camera alignment at this time is performed for maintaining the camera alignment accuracy because a time has passed from the time point of step S22 and the cameras 26 and 28 have been moved, but the process of step S35 may be omitted if it is not necessary.

Then, in step S36, the mounting position of the optical part 20 is computed based on the result of detection of the mounting positions of the optical parts 3A and 3B. Then, in step S37, the XY-stage 22 is moved by driving the XY-stage 22 so that the computed mounting position is aligned with the optical part 20 held by the head 30, and the Z-stage 24 is moved downward to mount the optical part 20 to the mounting board 1. Because the optical parts 3A and 3B are mounted to the positions corresponding to the interval of the functional parts 20a of the optical part 20, the functional parts 20a of the optical part 20 are in a state of being aligned with the respective optical parts 3A and 3B with good accuracy.

It should be noted that, after mounting the optical part 3A in step S34 and before computing the mounting position of the optical part 20 in step S36, the mounting position of the optical parts 3A and 3B and the holding position of the optical 20 may be detected so as to confirm that these parts have not been displaced from the previously detected positions.

Although tow optical parts 3A and 3B are used as the first mounting parts and one optical part 20 is used as the corresponding second mounting part in the above-mentioned embodiment, the present invention may be applied to a case where three or more optical parts are provided to one optical part 20. That is, the second mounting part can be arranged with respect to a plurality of first mounting apparatuses with good positional accuracy by mounting the plurality of first mounting parts while determining the mutual mounting positions of the plurality of first mounting parts on a board based on a result of image-recognition of the configuration of the second mounting part. Additionally, a plurality of optical parts 20 may be used as the second mounting parts, and a plurality of mounting parts 3A and 3B may be used as the first mounting parts. That is numbers of the first mounting parts and the second mounting parts are not limited to the numbers indicated in the above-mentioned embodiment.

Although the configuration of the optical part 20 is detected one by one so as to individually match the mounting positions of the optical parts 3A and 3B to the configuration of the optical part 20 in the above-mentioned mounting process, if the configuration of the optical part 20 hardly varies within a lot, the configuration of the optical part 20 may be detected one time within the lot and data thereof may be used.

Figure 14:
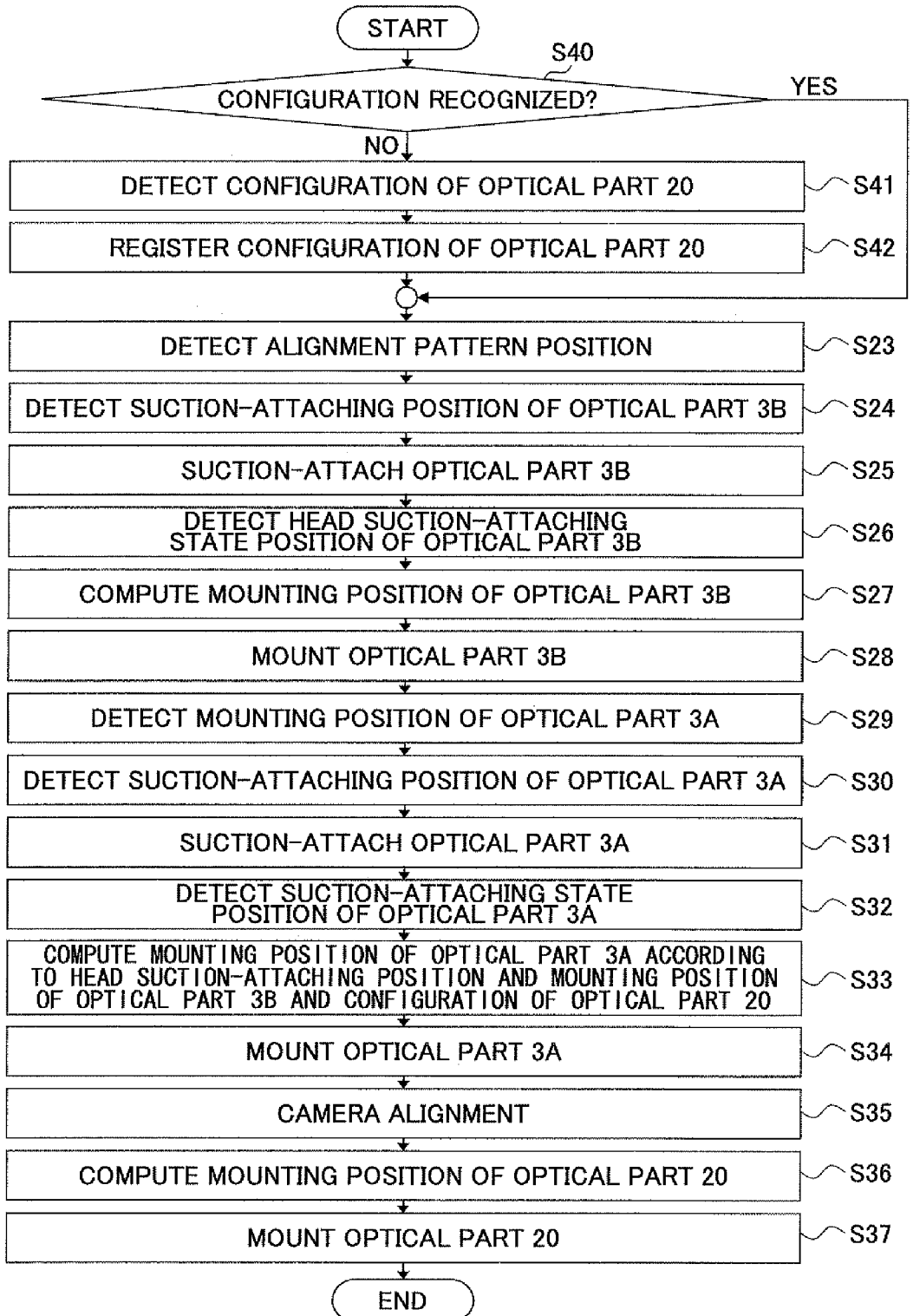
FIG. 14 is a flowchart of a mounting process when detecting a configuration of an optical part once and using the data in mounting thereafter.

FIG. 14 is a flowchart of a mounting process in the case of detecting the configuration of the optical part 20 only once and using the data thereof in subsequent mounting. In FIG. 14, steps that are the same as the steps illustrated in FIG. 13 are given the same step numbers, and descriptions there of will be omitted.

In the mounting process illustrated in FIG. 14, first, in step S40, it is determined whether or not the configuration of the optical part 20 has been detected. For example, in a case of mounting the first optical part 20 within one lot of the optical part 20, it becomes NO in step S40 because the configuration of the optical part 20 has not been detected, and the process proceeds to step S41. In step S41, the configuration of the optical part 20 is detected similar to the above-mentioned step S22. Subsequently, in step S42, the data of the configuration of the optical part 20 detected in step S41 is registered and saved. Thereafter, proceeding to step S23 illustrated in FIG. 13, the process from step S23 to step S37 is performed so as to mount the optical parts 3A and 3B and the optical part 20 to the mounting board 1.

On the other hand, if it is determined in step S40 that the configuration of the optical part 20 has been detected, the process proceeds to step S23 so as to perform the process from step S23 to step S37 using the configuration data of the optical part registered and saved so as to mount the optical parts 3A and 3B to the mounting board 1.

As mentioned above, for example, when the lot of the optical parts 20 is changed, a mounting process time can be shortened by detecting the configuration of the first optical parts 20 and saving the data thereof to use the data in mounting another optical part 20 in the same lot.

Figure 15:
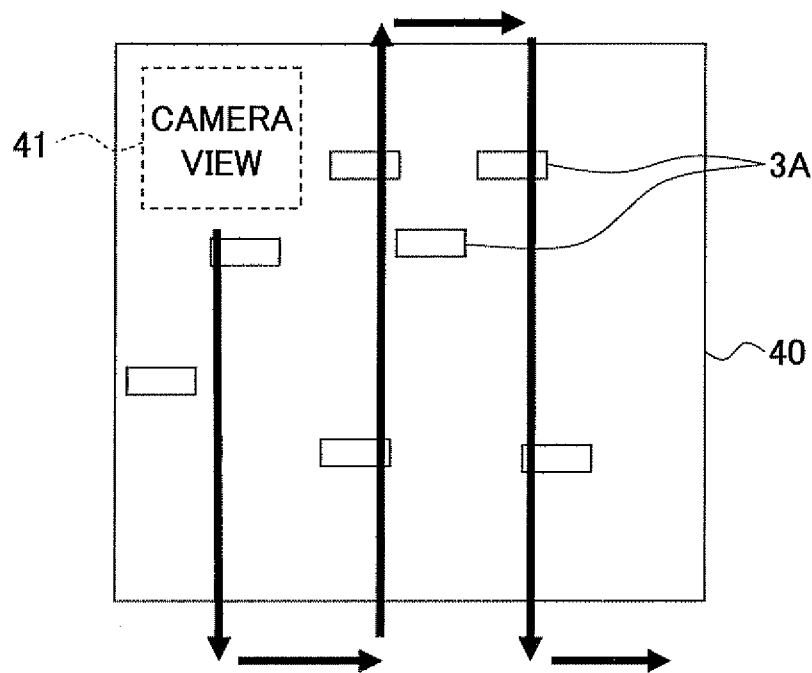
FIG. 15 is a plan view of a part tray in which an optical part is accommodated.

Next, a description will be given of a process of detecting a position of the part tray when taking the optical parts 3A and 3B and the optical part 20 out of the part tray. FIG. 15 is a plan view of the part tray in which optical parts are accommodated. In FIG. 15, a part tray 40 as an example is illustrated in which a plurality of optical parts 3A are accommodated. Here, the view 41 of the camera 26, which image-recognizes the optical part 3A, is considerably smaller than the entire size of the part tray 40. In this case, as indicated by arrows of FIG. 15, the entire part tray 40 is scanned by the camera so as to image-recognize the optical part 3A.

Figure 16:
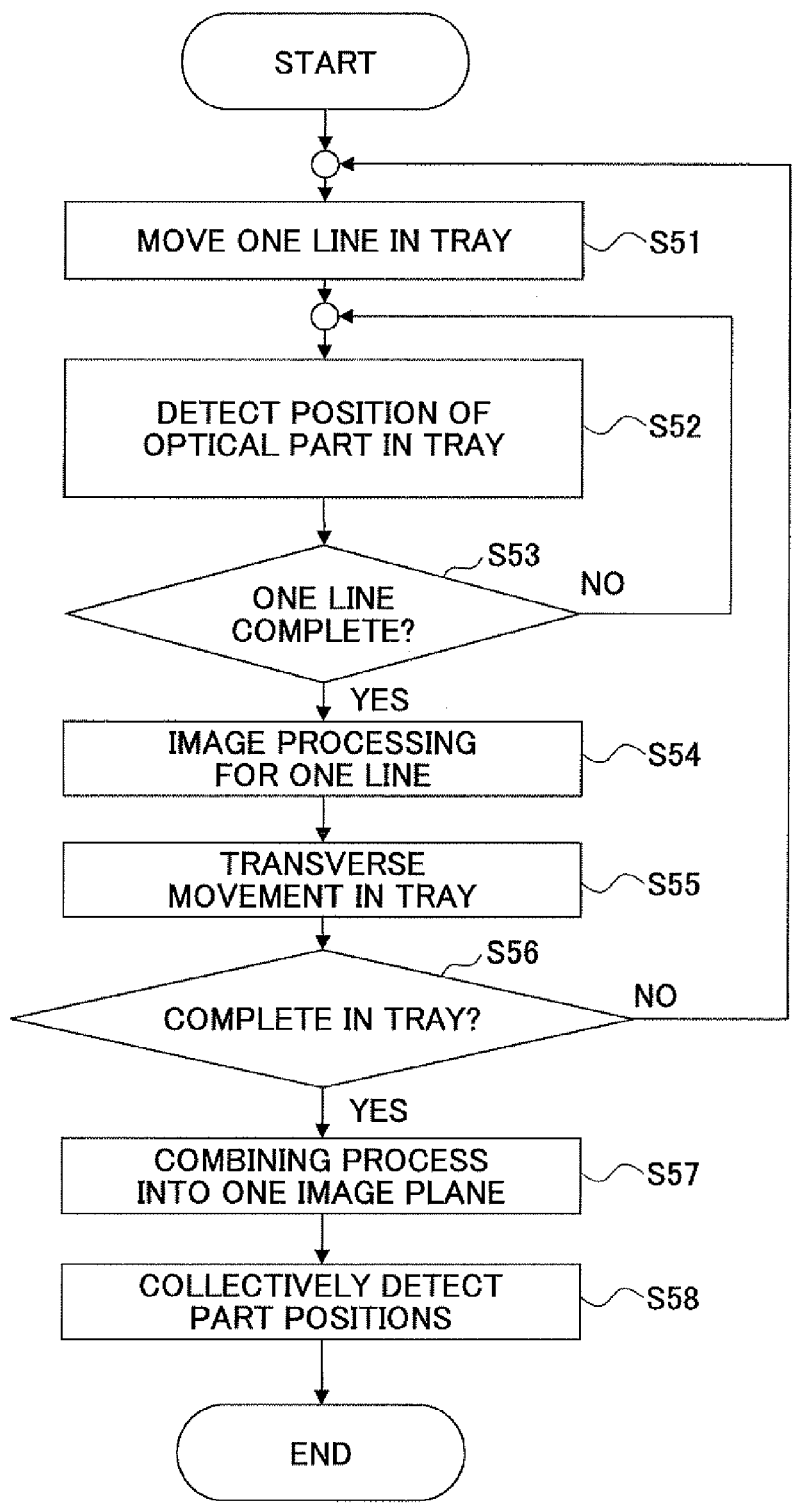
FIG. 16 is a flowchart of a process of detecting a position of an optical part in the part tray.

FIG. 16 is a flowchart of a process of detecting a position of the optical part 3A in the part tray 40. First, in step S51, the scan of the view of the camera 26 is started from the end of the part tray 40. In step S52, an image of the optical part 3A, which enters the view, is acquired while continuing the scan of the view of the camera 26. Then, in step S53, it is determined whether or not a scan of one line is ended. If the scan of one line has been ended, the process returns to step S52 so as to continue the detection of position of the optical part 3A while continuing the scan of the view of the camera 26.

If it is determined in step S53 that the scan of one line has been ended, the process proceeds to step S54 to save the image corresponding to the scanned one line. Then, in step S55, the view of the camera 26 is shifted in a transverse direction so as to align the view with the next line. Subsequently, in step S56, it is determined whether or not the scan of the entire part tray 40 has been ended. If the scan of the entire part tray 40 has not been ended, the process returns to step S51 so as to perform scanning of one line from the present position of the view of the camera 26. If it is determined that the scan of the entire part tray 40 has been ended, the process proceeds to step S57 to perform a process of combining a plurality of images acquired for each line into a single image to acquire an image of the entire part tray 40. Subsequently, in step S58, the position of each optical part 3A is detected from the image of the entire part tray 40 acquired by combining the images.

As mentioned above, when scanning a part tray larger than a camera view, each position of a plurality of optical parts 3A in the part tray 40 is detected collectively after combining a plurality of images acquired by scanning the camera view. Thereby, even if there is an optical part 3A of which an image of only a portion is taken by the scan of one line of the camera view, it becomes a complete optical part 3A on the combined image by combining an image taken by scanning a next line. For example, there is a larger merit that the process is simplified in detecting the optical parts collectively after combining the images than performing a process of detecting the optical parts 3A for each one line scan of the camera view and determining whether to recognize the optical part 3A, of which an image of only a half portion is taken. Additionally, there is no need to provide a wide view camera separately for image-recognition of a part tray, which reduces an increase in cost of the apparatus.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has(have) been described in detail, it should be understood that the various changes, substitutions, and alterations could be made hereto without departing from the spirit and scope of the invention.

What is claimed is:

1. A part mounting method of mounting first mounting parts and a second mounting part to a board, comprising:

taking an image of a configuration of the second mounting part and performing an image-recognition;

mounting said first mounting parts to said board based on a result of the image-recognition of the configuration of said second mounting part; and mounting said second mounting part to said board based on a result of an image-recognition of said first mounting parts mounted to said board, wherein when mounting a plurality of said first mounting parts and one piece of said second mounting part to corresponding positions, the mounting is performed while determining each other's positions of said plurality of said first mounting parts on said board based on the configuration of said second mounting part detected by the image-recognition.

2. The part mounting method as claimed in claim 1, including:

detecting a configuration by supporting said second mounting part and taking an image of a back surface thereof by a second camera;

supporting one of said first mounting parts and taking an image of a top surface thereof by a first camera and performing an image-recognition;

image-recognizing a mounting surface of said board by said first camera;

mounting said one of said first mounting parts, which has been image-recognized, to said board;

supporting another one of said first mounting parts and taking an image of a top surface thereof by said first camera and performing an image-recognition;

mounting said another one of said first mounting parts to said board based on the configuration of said second mounting part detected by said second camera; and mounting said second mounting part to said board based on a result of an image-recognition of positions of said first mounting parts on said board.

3. The part mounting method as claimed in claim 2, including:

after mounting said one of said first mounting parts to said board, detecting a mounting position by said first camera;

after mounting said another one of said first mounting parts to said board, detecting a mounting position by said first camera; and reflecting results of detections of the mounting positions in mounting said second mounting part.

4. The part mounting method as claimed in claim 2, wherein results of image-recognitions are corrected so that the positions of said first mounting parts in the image taken by said first camera and a position of said second mounting part in an image taken by said second camera are aligned with each other.

5. The part mounting method as claimed in claim 4, wherein said first camera and said second camera are opposed to each other and an alignment mark is arranged therebetween to perform said correction by image-recognizing the alignment mark by said first camera and said second camera.

6. The part mounting method as claimed in claim 2, wherein said second mounting part is supported and an image of a back surface thereof is taken by said second camera to detect a configuration thereof and a result of detection is saved as data, and, thereafter, the data is used when mounting another second mounting part.

7. The part mounting method as claimed in claim 1, wherein, when picking up said first mounting part or said second mounting part from a part tray, image data is acquired by taking an image of each part by dividing an area of the part tray and combining the image data in order to create an entire image of said part tray, and a position of said first mounting part or said second mounting part is detected from the entire image.

* * * * *